United States Patent [19]

Kim et al.

[11] Patent Number: 4,638,762
[45] Date of Patent: Jan. 27, 1987

[54] CHEMICAL VAPOR DEPOSITION METHOD AND APPARATUS

[75] Inventors: Myung K. Kim, Plainsboro Township, Middlesex County; Montri Viriyayuthakorn, Hamilton Township, Mercer County, both of N.J.

[73] Assignee: AT&T Technologies, Inc., Berkeley Heights, N.J.

[21] Appl. No.: 770,906

[22] Filed: Aug. 30, 1985

[51] Int. Cl.⁴ .............................................. C23C 13/08
[52] U.S. Cl. .................................... 118/725; 118/730
[58] Field of Search ................................ 118/725, 730

[56] References Cited
U.S. PATENT DOCUMENTS

| 3,424,629 | 1/1969 | Ernest ................................. | 118/730 |
| 3,603,284 | 9/1971 | Garnache ............................ | 118/730 |
| 3,617,371 | 11/1971 | Burmeister, Jr. ................... | 117/201 |
| 3,637,434 | 1/1972 | Nakanuma ........................... | 118/730 |
| 3,647,535 | 3/1972 | Naber ................................. | 117/212 |
| 3,719,166 | 3/1973 | Gereth ................................ | 118/730 |
| 3,775,062 | 11/1973 | Susuki et al. ...................... | 23/285 |
| 4,190,470 | 2/1980 | Walline .............................. | 148/175 |
| 4,322,592 | 3/1982 | Martin ................................. | 118/730 |
| 4,421,786 | 12/1983 | Mahajan et al. ................... | 427/82 |
| 4,430,149 | 2/1984 | Berkman ............................ | 156/613 |

OTHER PUBLICATIONS

J. Electrochem. Soc.: Solid-State Science and Technology; "Si Epitaxial Growth of Extremely Uniform Layers by a Controlled Supplemental Gas Adding System", by T. Suzuki, Y. Inoue, T. Aoyama and M. Maki, Jun. 1985, pp. 1480–1487.

Primary Examiner—Richard Bueker
Attorney, Agent, or Firm—J. F. Spivak

[57] ABSTRACT

A chemical vapor deposition apparatus particularly useful for forming uniformly thick epitaxial layers of III-V semiconductor compounds on a plurality of substrates comprises a susceptor for supporting the substrates contained within a housing, gas inlet and outlet ports including a plurality of gas inlet ports spaced around the periphery of the housing and wherein the susceptor is provided with a plurality of helical flights extending from top to bottom which control the gas flow pattern.

6 Claims, 7 Drawing Figures

CHEMICAL VAPOR DEPOSITION METHOD AND APPARATUS

TECHNICAL FIELD

This invention relates to semiconductor fabrication, and more particularly, to an improved method and apparatus for chemically vapor depositing materials in a chemical vapor deposition reactor.

BACKGROUND OF THE INVENTION

Chemical vapor deposition (CVD) is a dominant process in the semiconductor industry for growing thin solid films on substrates. Crucial to the success of a CVD process is the design of the reactor. A typical reactor design consists of a quartz jar and a susceptor. The substrates are placed on the susceptor which is maintained at a constant temperature by either RF induction or radiant heating. Reactant gases are introduced into a flow chamber formed by a quartz jar and the susceptor. The shape of the flow chamber is designed to deliver reactants to the wafers efficiently to yield uniform deposition. The performance of the reactor is measured in terms of growth uniformity, throughput and chemical consumption.

The demand for improved performance of CVD reactor systems and processes has increased rapidly with the advent of very large scale integrated circuits which necessitates the growth of films with highly uniform thickness and composition to meet the decrease in feature size. Further, new devices for fiber optic and high speed digital applications demand new capabilities in growing epitaxial layers by CVD of different materials. The need for improved CVD reactors and processes is more critical for the growth of electronic materials such as the III-V or II-VI semiconductor compounds which have been found to be very difficult to deposit uniformly using existing reactors developed for CVD of silicon. This difficulty is due to the different rate-controlling mechanism of the chemical reactions: the growth rate for III-V or II-VI epitaxial layers is generally controlled by a mass transfer process (commonly called diffusion-controlled process) while the growth rate of silicon epitaxial layers is controlled by the reaction kinetics at the surface of the silicon wafer substrates. A suitable reactor for a diffusion-controlled system is generally more difficult to design since it is strongly dependent on the flow geometry which influences the mass transfer process. Recent reports indicate that even for the relatively simple epitaxial deposition of gallium arsenide, good uniformity is difficult to achieve. Consequently, good deposition of such material has been accomplished potentially in single wafer reactors in which the chemical flow over the one wafer can be fully controlled and thoroughly mixed. However, for commercial production one must be able to simultaneously and uniformly deposit layers on a multiplicity of substrates. Also, epitaxial deposition of ternary or quaternary layers is even more difficult due to the increase in the number of chemical reactants and the added parasitic deposition on the reactor walls. Hence, improved apparatus design is required to obtain better thickness uniformity, with high throughput and processing yields, especially in the case of diffusion-controlled CVD systems.

SUMMARY OF THE INVENTION

An apparatus for chemical vapor deposition particularly useful for the deposition of epitaxial semiconductor layers or films on a semiconductor substrate comprises a susceptor confined within a housing to shield it from the external environment and forming a deposition chamber, a plurality of gas inlets and a gas exhaust orifice, means for heating the susceptor and means for affecting rotation of the susceptor, wherein the susceptor includes a plurality of helical flights extending from at or near the end of the susceptor closest to the inlet port to at or near tne end of the susceptor closest to the exhaust orifice.

DETAILED DESCRIPTION

While the novel reactor set forth herein is particularly useful for diffusion-controlled reactions, it should be understood that it is also useful for and should even perform better for less critical systems, namely, partially or totally kinetic-controlled reactions such as the deposition of silicon. Further, the novel reactor is also particularly suitable for the simultaneous deposition of a multiplicity of wafers or substrates onto which a film is to be deposited. The reactor uses a unique flow pattern of gas to deliver reactant species to the substrates so as to give rise to the proper cross and back mixing necessary for uniform deposition without using high chemical flow rate. It also makes possible a larger number of wafers to be deposited per run while maintaining uniformity of tnickness of the deposit from wafer to wafer and across a wafer as well as a relatively low flow rate.

Various configurations of typical prior art reactors for chemical vapor deposition are shown in FIGS. 1A-1D. As can be seen, these typical prior art reactors do not employ helical flights nor other of the preferred features of the current invention as hereinafter described. The figures show typical gas flow patterns of these reactors. Such flow leads to thickness uniformity problems of the deposit.

Figure 1A:
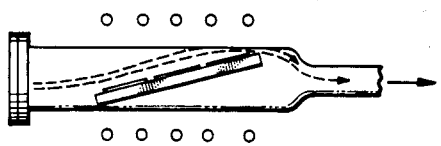
FIGS. 1A-1D are schematic elevational views of various prior art designs of CVD reactors.
Figure 1B:
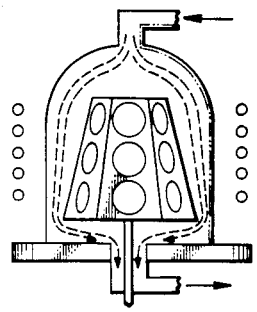
Figure 1C:
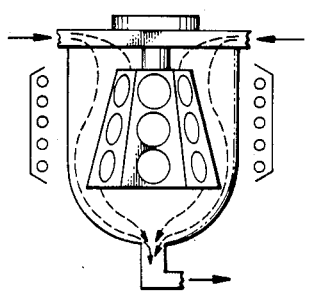
Figure 1D:
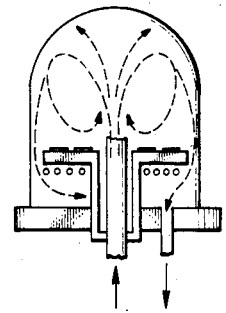
Figure 2:
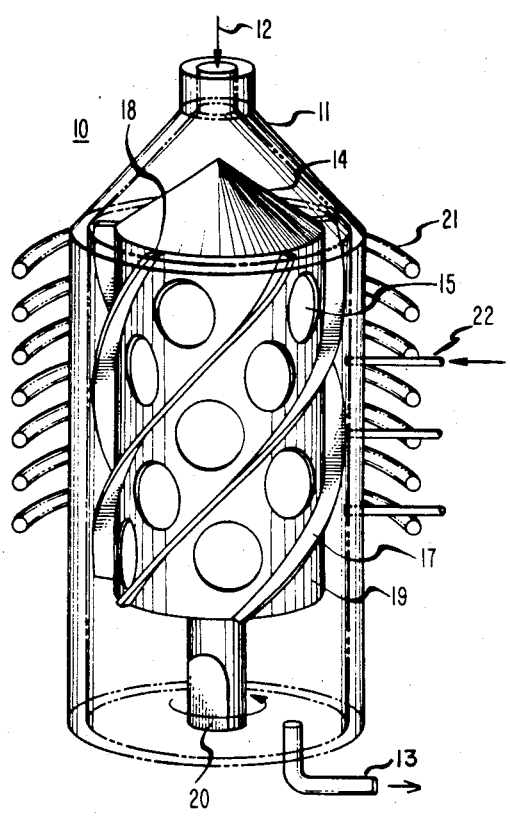
FIG. 2 is a schematic elevational view of a novel spiral flow reactor in accordance with this invention.
Figure 3:
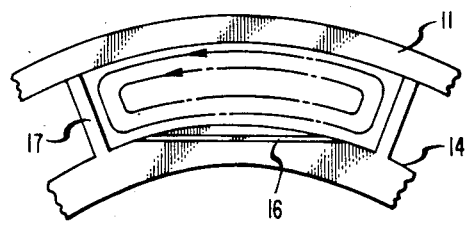
FIG. 3 is a partial cross-sectional view of a section of the reactor shown in FIG. 2 indicating the computed gas flow pattern in such a reactor.

A simplified version of an embodiment of the novel apparatus showing the concept of the invention is found with reference to FIGS. 2 and 3. In accordance with the apparatus as shown in FIG. 2, the reactor 10 comprises a housing such as a quartz bell jar 11 having a reactant gas inlet port 12 at the top of the bell jar 11 and a reactant gas outlet port 13 at the bottom of the bell jar 11. Alternatively, of course, one can provide a plurality of inlet ports for individual reactant gases which may be employed. When the reaction is to be run at low pressures, the reactor pressure is pumped down via the outlet port 13. Within the bell jar 11 is a susceptor 14, typically graphite, having spaced recesses 15 in which the substrates or wafers 16 to be coated are held. The spaced recesses 15 are arranged so that a plurality of such recesses 15 is separated by a plurality of spaced helical flights 17 extending from an upper portion 18 of the susceptor 14 above the upper most recess 15 to the lower portion 19 of the susceptor 14 below the lower most recess, the susceptor is preferably cylindrical or conical. Means, e.g., an axial center shaft 20, extending from the bottom of the susceptor 14 is provided to rotate the susceptor 14 around its vertical axis. The shaft 20 is coupled to a motor (not shown) to rotate the susceptor 14 within the bell jar 11. The apparatus also includes means for heating the susceptor 21, e.g., an RF coil, which surrounds the outside of the bell jar 11 adjacent to the susceptor 14. Alternatively, of course, one may use other heating means such as an infrared heating source or a resistance heater. It has also been found to be preferred to have a plurality of vertically spaced reaction gas injection ports 22 extending through and around the side of the bell jar 11 so as to enable additional reactant gases to be injected in the spaces between the helical flights 17.

Referring to FIG. 3, the gas flow achieved in the vicinity of the wafer using an apparatus as described is shown. As can be seen, the flow pattern achieved results in a uniform mixing of the reactant gases which in turn results in the deposition of films having essentially uniform thickness with only moderate gas flow rates.

Figure 4:
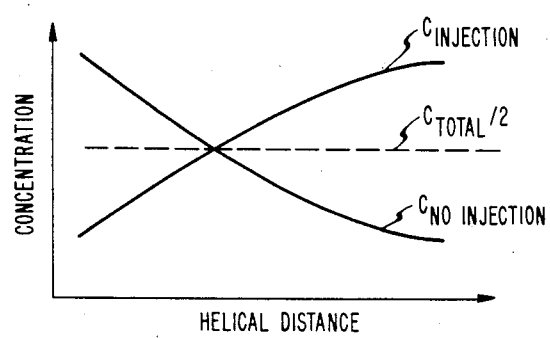
FIG. 4 is a plot of helical distance traveled by reactant gases versus gas concentration.

FIG. 4 indicates the importance of the use of reactant gas injection ports through the bell jar. The figure is a plot representing reactant gas concentration as a function of distance along the helix due to gas supplied via the upper inlet port 12 ($C_{no\ injection}$) and gas supplied via the injection ports 22 ($C_{injection}$). The combination of these concentrations ($C_{total/2}$) represents the combined concentration of reactant gases along the helix. As can be seen $C_{total/2}$ is constant. It should be noted that the graph is a theoretical representation and has not been plotted from actual data. It is provided as a means for better understanding the benefit derived from the use of side injection ports 22 with the helical flights 17.

It should be understood that a commercial reactor may include other features such as a concentric dual bell jar assembly to insure cleanliness and help prevent the escape of gas; means for raising and lowering the susceptor and/or bell jars for ease of loading; and means, e.g., valves, for controlling gas flow rates. As an example of the use of the apparatus, typical conditions calculated for the growth of an epitaxial GaAs layer on an Si wafer are: reactor pressure, 40-760 torr; wafer (and susceptor) temperature, 600° C.-700° C.; total reactant gas flow rate, 10-20 l/min.; epitaxial growth rate, 2-3 μm/hr.; and thickness uniformity, ±3%.

What is claimed is:

1. A chemical vapor deposition apparatus comprises a susceptor confined within a housing to form a deposition chamber, a plurality of gas inlet orifices for the entry of gases into the chamber, a gas outlet orifice to expel gases from the chamber, means for heating the susceptor and means for rotating the susceptor, wherein the susceptor includes means for supporting a plurality of substrates around the susceptor and a plurality of helical baffles extending from a top region of the susceptor to a bottom region of the susceptor.

2. The apparatus recited in claim 1, including a plurality of spaced gas inlet means through the periphery of the housing and a main gas inlet port above the susceptor.

3. The apparatus recited in claim 1, wherein the susceptor is graphite and the heating means is an RF coil.

4. The apparatus recited in claim 2, including means for controlling the gas flow rates to achieve a uniform gas composition over each substrate.

5. The apparatus recited in claim 2, wherein the helical baffles on the susceptor extend from above the highest substrate support means to below the lowest substrate support means.

6. The apparatus recited in claim 1, wherein the susceptor is cylindrical or conical in shape.

* * * * *